(12) United States Patent
Caletka et al.

(10) Patent No.: US 7,510,912 B2
(45) Date of Patent: Mar. 31, 2009

(54) METHOD OF MAKING WIREBOND ELECTRONIC PACKAGE WITH ENHANCED CHIP PAD DESIGN

(75) Inventors: David V. Caletka, Apalachin, NY (US); Varaprasad V. Calmidi, Binghamton, NY (US); Sanjeev Sathe, San Jose, CA (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 84 days.

(21) Appl. No.: 11/822,573

(22) Filed: Jul. 9, 2007

(65) Prior Publication Data
US 2007/0254408 A1 Nov. 1, 2007

Related U.S. Application Data

(62) Division of application No. 11/152,048, filed on Jun. 15, 2005, now Pat. No. 7,253,518.

(51) Int. Cl.
*H01L 21/00* (2006.01)
(52) U.S. Cl. ..................... 438/122
(58) Field of Classification Search ............... 438/122, 438/125; 257/706–712, E23.101
See application file for complete search history.

(56) References Cited

U.S. PATENT DOCUMENTS

| | | | |
|---|---|---|---|
| 4,705,917 A | 11/1987 | Gates, Jr. et al. | |
| 4,922,324 A | 5/1990 | Sudo | |
| 5,026,624 A | 6/1991 | Day et al. | |
| 5,300,402 A | 4/1994 | Card, Jr. et al. | |
| 5,463,250 A | 10/1995 | Nguyen et al. | |
| 5,616,958 A | 4/1997 | Laine et al. | |
| 6,077,766 A | 6/2000 | Sebesta et al. | |
| 6,124,546 A | 9/2000 | Hayward et al. | |
| 6,521,990 B2 * | 2/2003 | Roh et al. | 257/706 |
| 6,522,015 B1 | 2/2003 | Glenn et al. | |
| 6,683,383 B2 | 1/2004 | Gleixner et al. | |
| 6,853,058 B2 | 2/2005 | Cobbley | |
| 7,049,696 B2 * | 5/2006 | Kubo | 257/706 |

* cited by examiner

*Primary Examiner*—Nathan W Ha
(74) *Attorney, Agent, or Firm*—Hinman, Howard & Kattell; Mark Levy; Lawrence Fraley

(57) ABSTRACT

A method of making a wirebond electronic package which includes a semiconductor chip bonded to the upper surface of an organic laminate substrate, including to a thermal material located on the substrate and comprised of a plurality of thermally conductive concentric lines. These lines form paths of heat escape for the chip during operation thereof and may operate in combination with other elements to extend the heat paths. Concentric lines also assure sufficient bonding area on the substrate so as to prevent delamination of the chip from the substrate as may occur during high temperatures associated with subsequent processing such as solder ball re-flow.

6 Claims, 2 Drawing Sheets

METHOD OF MAKING WIREBOND ELECTRONIC PACKAGE WITH ENHANCED CHIP PAD DESIGN

CROSS REFERENCE TO CO-PENDING APPLICATIONS

This application is a divisional application of Ser. No. 11/152,048, filed Jun. 15, 2005 now U.S. Pat. No. 7,253,518.

TECHNICAL FIELD

The present invention relates, in general, to electronics packages, one example being a chip carrier having a circuitized substrate for interconnecting a semiconductor chip to a printed circuit board (PCB). In particular, the invention relates to such circuitized substrate packages and the like for use in information handling systems (e.g., computers, telecommunications systems, etc.).

BACKGROUND OF THE INVENTION

Circuitized substrates, such as those used in chip carrier electronic packages, have been and continue to be developed for many applications. Such a circuitized substrate typically comprises a plurality of conductive and organic dielectric layers laminated together to form a multilayered structure, with the upper layer designed for redistributing electrical signals from the chip mounted on the circuitized substrate through the substrate onto a larger circuitized area so that the circuitized substrate can properly interface with the hosting PCB having said larger area. An earlier version of chip carriers used ceramic as the dielectric rather than more recently developed organic materials of the type described in greater detail hereinbelow.

Generally speaking, there are two known types of such laminate organic chip carriers: those referred to as "wirebond" chip carriers; and those referred to as "C4" (for controlled collapse chip connection) chip carriers. In both, a chip is mounted on and electrically coupled to the carrier substrate's top side (upper) circuitry. In the case of a wirebond carrier, these connections are made using ultra thin aluminum or gold wires (called "wirebonds" by many) which are bonded at one end to chip contact sites on the chip's upper surface and at the other end to wirebond pads on the carrier substrate's upper surface circuitry. The chip is mounted on the underlying substrate preferably using a suitable adhesive. The carrier may then in turn be mounted on and electrically coupled to the PCB's upper surface circuitry using a plurality of solder balls which are mounted on pads on the PCB's upper surface and which form part of said circuitry. For "C4" chip carriers, the chip is coupled to the carrier substrate's circuitry using solder balls, the carrier having pads for having the solder balls secured thereto. An encapsulant material may be used to surround the solder balls in the array. The carrier's pads, like those of the PCB, in turn are coupled to the carrier's substrate internal circuitry which passes through the substrate to its undersurface, where solder balls are also used to coupled the substrate to the PCB (forming a ball grid array, or BGA final package). The present invention relates particularly to chip carriers of the wirebond type defined above in which the chip is wirebonded to the carrier substrate.

It is, of course, a key objective of all electronic package manufacturers to produce smaller and higher density packages which are still capable of increased capacity over previous structures. At least two concerns arise when attempting such miniaturization, particularly when considering that increased operational demands on such devices as semiconductor chips results in such chips operating at greater and greater temperatures. To prevent package breakdown as a result of possible chip failure, providing adequate, effective heat sinking for the chip is absolutely necessary. A second concern involves circuit density and particularly the ability to increase such density and yet provide effective connections between all of the conductors (substrate and chip) which form part of the package's electrical circuitry. The present invention, as defined herein, is particularly concerned with providing such effective heat removal from the chip, while substantially preventing chip separation (delamination) from the underlying organic laminate substrate by assuring an effective bond between chip and substrate. Significantly, the invention is able to do so while assuring a package with highly dense circuitry.

The following patents describe various types of known chip packages.

In U.S. Pat. No. 6,853,058, issued Feb. 8, 2005, there is described a semiconductor package having a semiconductor die "receiving member" configured to accept a semiconductor die in either the flip-chip or the wirebond orientations. First contact sites on a die receiving surface provide electrical connection with a flip-chip component. Second contact sites provide electrical connection with a wirebond component. Electrically conductive traces connect the first and second contact sites with terminal contact sites. The semiconductor package assembly may further include the flip-chip or wirebond component mounted over the die receiving surface. The assembly is further described as possibly including a mounting substrate in electrical connection with the terminal contact sites.

In U.S. Pat. No. 6,683,383, issued Feb. 27, 2004, there is described a wirebond structure which includes a copper pad formed on or in a surface of a microelectronic die (chip). A conductive layer is included in contact with the copper pad and a bond wire is bonded to the conductive layer. The conductive layer is formed of a material to provide a stable contact between the bond wire and the copper pad in at least one of an oxidizing environment and an environment with temperatures up to at least about 350 degrees Celsius (C.).

In U.S. Pat. No. 6,522,015, issued Feb. 18, 2003, there is described a "micro-machine" package which includes a "micro-machine" chip having an area in a front surface of the chip. The package further includes a controller chip having a rear surface and a front surface. Bond pads are on the front surface of the controller chip. A bead secures the rear surface of the controller chip to the front surface of the micro-machine chip. By mounting the controller chip directly on the micro-machine chip, the size of the package is minimized. Further, the bead and controller chip form an enclosure around the micro-machine area. This enclosure protects the micro-machine area from the ambient environment.

In U.S. Pat. No. 6,124,546, issued Sep. 26, 2000, there is described a semiconductor integrated circuit chip package which includes top and bottom interposers, a semiconductor die attached to the top interposer, a wirebond or a flip-chip connector connected between the die and the top interposer, and a tab bond providing an electrical connection from the wirebond or the flip-chip connector to outside the bottom interposer.

In U.S. Pat. No. 6,077,766, issued Jun. 20, 2000, there is described an electronic structure, and associated method of fabrication, that includes a substrate having attached circuit elements and conductive bonding pads of varying thickness. Pad categories relating to pad thickness include thick pads (17 to 50 microns), medium pads (10-17 microns), and thin pads (3 to 10 microns). A thick pad is used for coupling a BGA package to a substrate with attachment of the BGA package to a circuit card. A medium pad is useful in flip-chip bonding of a chip to a substrate by use of an interfacing small solder ball. A thin copper pad, coated with a nickel-gold layer, is useful for coupling a chip to a substrate by use of a wirebond interface. The electrical structure includes an electrical coupling of two pads having different thickness, such that the pads are located either on the same surface of a substrate or on opposite sides of a substrate.

In U.S. Pat. No. 5,616,958, issued Apr. 1, 1997, there is described an electronic package which includes a thermally conductive, e.g., copper, member having a thin layer of dielectric material, e.g., polyimide, on at least one surface thereof. The copper thermally conductive member provides heat sinking for the chip during operation. A high density circuit pattern is provided on the polyimide and is electrically connected, e.g., using solder or wirebonds, to the respective contact sites of a semiconductor chip. If wirebonds are used, the copper member preferably includes an indentation therein and the chip is secured, e.g., using adhesive, within this indentation. If solder is used to couple the chip, a plurality of small diameter solder elements are connected to respective contact sites of the chip and to respective ones of the pads and/or lines of the provided circuit pattern. Significantly, the pattern possesses lines and/or pads in one portion which are of high density and lines and/or pads in another portion which are of lesser density. The chip is coupled to the higher density portion of the circuitry which then may "fan out" to the lesser (and larger) density lines and/or pads of the other portion of the circuitry. The resulting package is also of a thin profile configuration and particularly adapted for being positioned on and electrically coupled to a PCB or the like substrate having conductors thereon.

In U.S. Pat. No. 5,463,250, issued Oct. 31, 1995, there is described a package for power semiconductor components which permits thermal dissipation and current conductance. The package includes a frame assembly bonded to a substrate on which a power semiconductor chip is mounted. The frame assembly has a wirebond grid for connecting short, uniform length wirebonds to the surface of the chip. The grid is configured so as to have a portion overlaying and spaced from the chip a distance less than a distance required to connect a wirebond of optimal length to each contact site of the chip. The package also uses an inner mounting pad on which the power semiconductor chip is directly mounted. The coefficient of thermal expansion of both the chip and the copper are described as being comparable. A ceramic "core" is located beneath the pad and includes a plurality of spaced copper "vias" which are described as being capable of restricting thermal expansion.

In U.S. Pat. No. 4,922,324, issued May 1, 1990, there is described a semiconductor integrated circuit device which includes a package base and a cavity formed with a ground electrode layer thereon. A semiconductor integrated circuit chip is provided on the ground electrode layer. De-coupling capacitors are provided on the surface of the cavity. A ground metal plate and outer leads are formed on the surface of the bottom of the package base. A metal connector is provided through the package base to connect, both electrically and thermally, the ground electrode layer and the ground metal plate.

In U.S. Pat. No. 4,705,917, issued Nov. 10, 1987, there is described a microelectronic package of the aforementioned, earlier ceramic type, designed for the protection, housing, cooling and interconnection of the microelectronic chip. The package is made of a plurality of ceramic layers, each of which carries a particular electrically conductive pattern and which have interior openings therein so as to provide recesses in which the chip and discrete capacitors can be located and connected.

As defined herein, the present invention provides for enhanced thermal sinking from the semiconductor chip in a package which utilizes organic dielectric materials as part of the laminated substrate while also providing an effective chip-substrate adhesive bond in such a manner so as to substantially prevent delamination of the chip from the substrate, e.g., during subsequent solder ball re-flow processing. It is believed that such an invention would represent a significant advancement in the art.

OBJECTS AND SUMMARY OF THE INVENTION

Accordingly, it is an object of this invention to enhance the art of electronic packaging and of information handling systems utilizing same.

It is another object of the invention to provide an electronic package that includes a circuitized substrate that substantially prevents delamination of the chip from the substrate while assuring a sound path for chip heat removal.

It is still another object of the invention to provide an information handling system utilizing such an electronic package mounted on a suitable substrate such as a printed circuit board which in turn is positioned in the system.

According to one aspect of the invention, there is provided a wirebond electronic package comprising an organic laminate substrate having an external surface, an electrically conductive circuit layer positioned on the external surface of the organic laminate substrate and including a plurality of wirebond pads, a semiconductor chip positioned on the external surface of the organic laminate substrate and electrically coupled to wirebond pads of the electrically conductive circuit layer, and a pattern of thermally conductive material positioned on the external surface of the organic laminate relative to the electrical circuit, this pattern of thermally conductive material including a plurality of substantially concentric lines. The semiconductor chip is thermally coupled to the pattern of thermally conductive material when the semiconductor chip is positioned on the external surface of the organic laminate substrate.

According to another aspect of the invention, there is provided an information handling system comprising a housing, a printed circuit board positioned within the housing, and a wirebond electronic package including an organic laminate substrate having an external surface, an electrically conductive circuit layer positioned on the external surface of the organic laminate substrate and including a plurality of wirebond pads, a semiconductor chip positioned on the external surface of the organic laminate substrate and electrically coupled to wirebond pads of the electrically conductive circuit layer, and a pattern of thermally conductive material positioned on the external surface of the organic laminate relative to the electrical circuit, this pattern of thermally conductive material including a plurality of substantially concentric lines. The semiconductor chip is thermally coupled to the pattern of thermally conductive material when the semiconductor chip is positioned on the external surface of the organic laminate substrate.

According to yet another aspect of the invention, there is provided a method of making a wirebond electronic package comprising providing an organic laminate substrate having an external surface, forming an electrically conductive circuit on the external surface of the organic laminate substrate including a plurality of wirebond pads, forming a pattern of thermally conductive material on the external surface relative to the wirebond pads, this pattern of thermally conductive material including a plurality of substantially concentric lines, positioning a semiconductor chip on the external surface such that the semiconductor chip is thermally coupled to the plurality of concentric lines, and electrically connecting the semiconductor chip to the plurality of wirebond pads.

The above objects, advantages and features of the present invention will become more readily apparent from the following detailed description of the presently preferred embodiments as illustrated in the accompanying drawings.

BEST MODE FOR CARRYING OUT THE INVENTION

Figure 1:
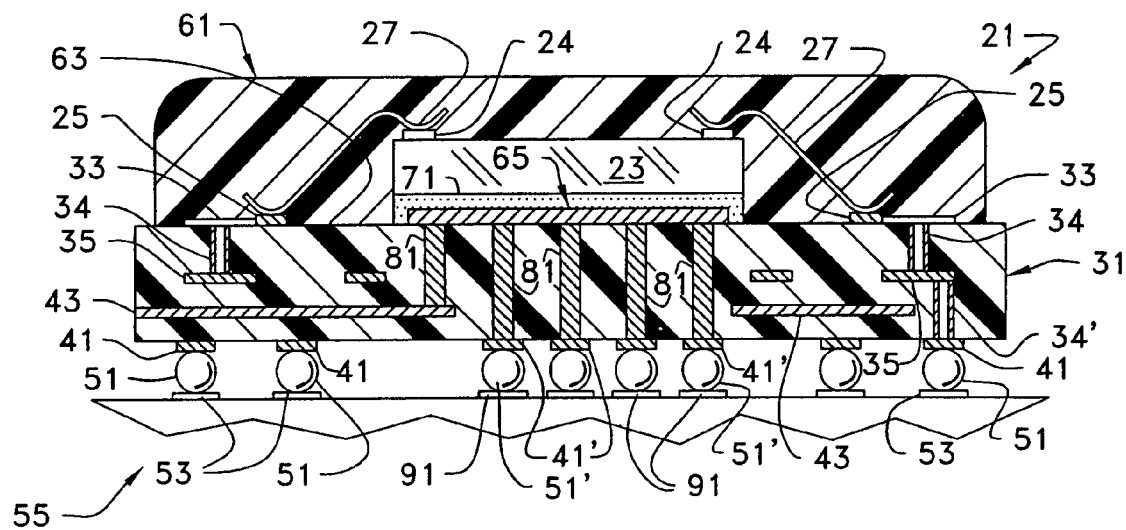
FIG. 1 is a side elevational view, in section and on a much enlarged scale, showing a wirebond electronic package according to one embodiment of the invention.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "circuitized substrate" as used herein is meant to include substrates having at least one (and preferably more) dielectric layer(s) and at least one (and preferably more) metallurgical conductive layer(s). Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imageable materials, and other like materials wherein the conductive layers are each a metal layer (e.g., power, signal and/or ground) comprised of suitable metallurgical materials such as copper, but may include or comprise additional metals (e.g., nickel, aluminum, etc.) or alloys thereof. If the dielectric materials for the structure are of a photo-imageable material, it is photo-imaged or photo-patterned, and developed to reveal the desired circuit pattern, including the desired opening(s) as defined herein, if required. The dielectric material may be curtain-coated or screen-applied, or it may be supplied as dry film. Final cure of the photo-imageable material provides a toughened base of dielectric on which the desired electrical circuitry is formed. An example of a particularly useful photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. The dielectric layers taught herein may be typically about 2 mils to about 4 mils thick, but also thicker or thinner if requirements dictate.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

In FIG. 1, there is shown a much enlarged, sectional view of a wirebond chip carrier electronic package 21 according to one embodiment of the present invention. Package 21 includes a semiconductor chip 23 of the wirebond type, meaning that it includes a plurality of contact sites 24 on its upper surface which are designed for being electrically coupled to respective wirebond pads 25 using a plurality of fine wires 27, e.g., of aluminum or gold. Pads 25 are positioned in a rectangular pattern on the upper surface of a circuitized substrate 31 formed in accordance with the unique teachings of the invention and described in greater detail below. Pads 25 are preferably copper or copper alloy and form part of the electrical circuit on the substrate's upper surface, this circuit possibly also including circuit lines (or traces), solder pads, and the like, all of which are known in the art as forming part of substrate circuitry. Such upper circuitry also typically includes gold plating thereon for enhanced connectivity, as is known. Only a portion of such circuitry, this being parts of various lines 33, are shown in FIG. 1 and also in FIG. 2. Such lines are used herein to couple the pads 25 to other parts of the substrate, as well as possibly to internal circuitry thereof. For example, the line 33 to the right in FIG. 1 couples to an internal "via" 34, a conductive thru-hole which, in the FIG. 1 embodiment, is further coupled to a conductive element (e.g., a line) 35 which forms part of a circuit layer within the substrate. Additional elements for this layer are shown along the plane to the left of element 35, these also preferably in the form of lines or traces. Element 35 is in turn electrically coupled using another internal "via" 34' to an external pad 41 formed on the undersurface of substrate 31. Similarly, line 33 to the left is coupled to an internal via 34 which terminates on another signal line element 35, but said element 35 is not shown as coupled to another via or like opening. Instead, this left side signal line is preferably connected to other circuitry within the substrate, either in the direction of the viewer or into the depth of this drawing.

The term "via" is used herein to indicate an electrically conductive opening which, as known in the art, comprises a bare opening formed within the dielectric (e.g., using a laser or mechanical drills) which is then typically plated with suitable metallurgy (e.g., copper) to render the opening conductive. Conductive paste may also be used in addition to the plating or as a substitute therefore. An internal "via" is one such as shown by the numerals 34 in FIG. 1, in comparison to an opening of the also plated variety which extends through the entire thickness of the substrate. The latter conductive openings are referred to in the art as plated through holes or, simply, PTHs. In the event that an internal "via" is desired which is entirely encased within the substrate, this may also be referred to as a "blind" via, meaning that it is not discernible from an external inspection of the substrate. Thus, the term "thru-hole" as used herein is meant to include all three types of such conductive openings, and that such openings may include conductive plating on the walls thereof and/or known conductive paste as the electrically conductive medium. The former (plated openings) are preferred. Substrate 31 is adapted for having several of all three of these kinds of conductive openings as part thereof, all of which may be formed using convention PCB processing, and further definition is not necessary.

In addition to the internal circuit layer which includes signal line element 35, substrate 31 may further include an internal power or ground plane 43, also preferably of copper (as is the circuit layer). Such internal planes are typically of more robust (and thicker) construction than signal layers used in known electronic packages and printed circuit boards, and such is preferably the case for plane 43. In a preferred embodiment, plane 43 possesses a thickness from about 0.025 millimeters (mm) to about 0.1 mm. In comparison, the signal elements 35 may each possess a thickness of about 0.025 mm to 0.05 mm. Substrate 31 is thus of the multilayered variety, including a plurality of dielectric layers and conductive layers sandwiched (laminated) together to form the structure shown. In one example, a total of 4 conductive layers and 3 dielectric layers may be used. Thus, it is understood that several individual dielectric layers may be utilized and that the resulting substrate is formed using lamination of these layers along with the respective conductive layers. Such materials have a modulus, or stiffness, which can be effectively much lower than that of the metallic conductive layers (10-20 M psi) but still of sufficient stiffness (>10 ksi) to couple the metallic layers together following a lamination process. As indicated, each such conductive layer is preferably of copper or copper alloy and the dielectric layers of one of the aforementioned dielectric materials. Formation is accomplished by selecting individual dielectric layers and forming thereon the desired circuit pattern or planar member, preferably using conventional photolithographic processing in which a photo-resist is coated onto a solid copper sheet, exposed according to a pre-determined pattern, and "developed" (removed) to expose the desired pattern there-under. The exposed copper is then etched using a suitable etchant such as cupric chloride, leaving the desired pattern. Such photolithographic processing is known in the art and further description not deemed necessary. Each of these "sub-composites" of a dielectric layer with formed circuitry thereon is then laminated together with other such sub-composites using the afore-mentioned lamination processing, to form the structure such as shown in FIG. 1.

The underlying pads 41 are also preferably formed using the above conventional photolithographic processing, and preferably following lamination of the sub-composites defined above. As seen in FIG. 1, these pads are designed for having a solder ball 51 bonded thereto to in turn couple the pad to a corresponding pad 53 of a conventional PCB 55 onto which package 21 is positioned. Solder balls 51 are preferably of conventional lead-tin composition and re-flowed using conventional BGA technology, so further description is not considered necessary.

It is understood that the particular circuit layers and connecting thru-holes shown herein are for representative purposes only and are not meant to limit this invention. Several other combinations of thru-holes, signal lines, ground or power planes, etc. are well within the scope of this invention and too numerous to mention.

Although only two wires 27 are shown in FIG. 1, several additional such wires are preferably utilized to connect each of the sites 24 to each of the corresponding wirebond pads 25. In one example, a total of 340 sites 24 may be coupled to a corresponding, similar number of pads 25. Connection is accomplished using conventional wirebonding apparatus and processes, and further description is not considered necessary. Protection of these delicate wires, as well as of chip 23, is preferably accomplished using a conventional dielectric over-mold material 61, which is molded over the package following chip placement and wire coupling. A preferred mold material to accomplish this is sold under the product names HYSOL FP4451 and HYSOL FP4450LV, available from Loctite, having a business address at 43 James Street, Homer, N.Y. Such over-mold materials and resulting structures are known and further definition is not necessary.

Figure 2:
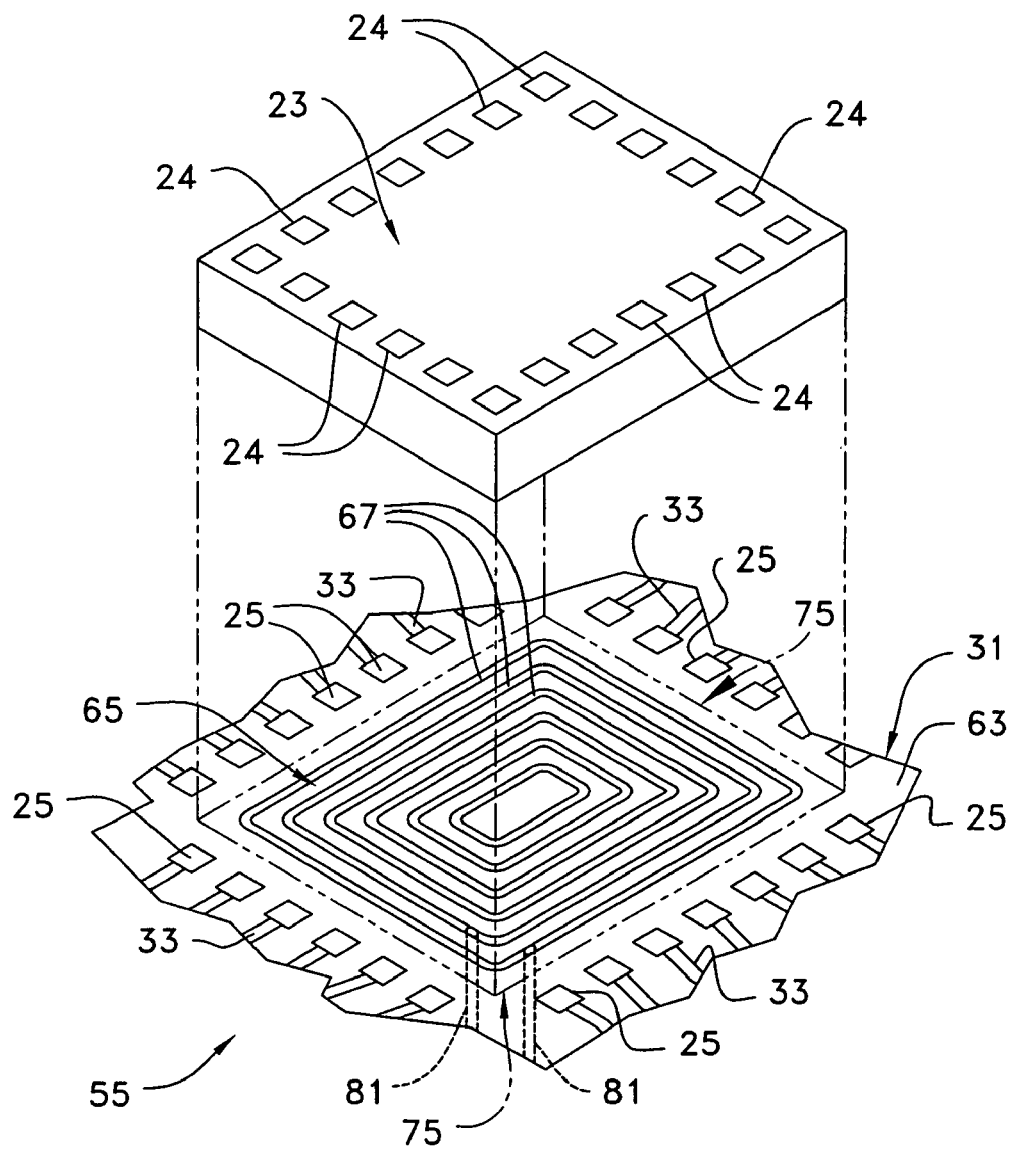
FIG. 2 is a partial perspective view, on a much enlarged scale over the view of FIG. 1, illustrating a pattern of thermally conductive material positioned on the external surface of an organic laminate substrate, according to one aspect of the invention.

FIG. 2 represents a better view of part of the upper surface 63 of the organic laminate substrate 31, and a significant feature of this invention. In addition to the circuitry on upper surface 63 including wirebond pads 25, there is also provided a pattern of thermally conductive material 65 in the form of a plurality of concentric lines 67 located on the surface in such a manner as to be substantially surrounded by the pattern of pads 25. Lines 67 are preferably copper or copper alloy and of the same material as the circuitry including pads 25, and are also provided with a gold cover layer (not shown), provided simultaneously when provided on the circuitry. Further, lines 67 are preferably formed simultaneously with the formation of the substrate's upper circuitry and thus using the defined photolithographic processing. As seen in FIG. 2, this pattern of material 65 is designed for having chip 23 positioned thereon and thereby in thermal connection therewith (see also FIG. 1). Preferably a suitable thermal adhesive 71 (shown in FIG. 1 only) is used, to bond the chip to the upper surfaces of lines 67. A preferred adhesive to accomplish this is Ablebond 965-IL, available from Ablestik, having a business address at 20021 Susana Road, Rancho Dominguez, Calif. 90221. Several other thermal adhesives are possible for this purpose and further description is not deemed necessary. Lines 67 each form a substantially rectangular pattern with the larger pattern located at a position slightly inside the outer periphery 75 (shown in phantom in FIG. 2) of chip 23 when it rests in position atop material 65.

Each of the concentric lines 67 preferably has a thickness of about twenty microns, or approximately the same as the pads 25 and remainder of the topside circuitry. Each line 67 also preferably has a width of about twenty mils. These dimensions, for a pattern of six lines as shown in FIG. 2, with the lines spaced apart a distance of about 0.8 mm, are preferred for having a chip positioned atop thereof having width and length dimensions of 17 mm and 17 mm, respectively. The outer periphery of the chip is thus larger than the outer periphery of the concentric line pattern. The pattern of lines 67 may be of a different configuration than shown, e.g., of substantially oval or annular shape for all lines, etc. The use of radial extending lines is also possible. The invention is not limited to the closed rectangular orientation of lines in FIG. 2. In fact, it is possible for the pattern to include one or more lines of "open" shape, meaning that each does not have to form a closed form. Combinations of such lines and shapes are well within the scope of one skilled in the art. In addition to lines 67, substrate 21 further includes a plurality of thermally conductive members 81 positioned within the organic laminate substrate 31 in physical contact (and thus also thermal contact) with the plurality of concentric lines 67. Only two such members are shown in FIG. 2 for ease of illustration, while five such members are shown in FIG. 1. Preferably, at least one such member 81 is coupled to each respective line 67, and it is also possible to include more such members 81 for each line. In one embodiment of the invention, a total of 112 members 81 were utilized, coupled to the six-line pattern described above and as shown in FIG. 2. Members 81 are preferably copper, and may be in the form of a thick copper plating on the internal walls of openings formed (e.g., using laser or mechanical drills) within substrate 31. Such openings, as shown in FIG. 1, may extend through the entire thickness of the substrate (four such openings are of this type in FIG. 1) but may also extend only a partial depth within the substrate, as is the case for the opening to the far left in FIG. 1 which terminates on conductive plane 43 (all such openings may terminate on plane 43, if the plane is extended further across the width of the substrate, or, alternatively, all openings may extend entirely to the substrate undersurface—several combinations are well within the skills of one with skill in the art). Members 81 are preferably of the same width as lines 67, or, in the above embodiment, about twenty mils, but may indeed be smaller (e.g., have twelve mil diameters compared to twenty mil line widths).

Lines 67 and members 81 thus combine to provide a plurality of thermal paths from chip 23 through the entire thickness of substrate 31 and/or to a thermally conductive plane within the substrate, to assure effective heat sinking of the chip during operation thereof. Understandably, heat passing through the entire substrate thickness exits the substrate at its undersurface while that which reaches the internal conductive plane 43 is distributed along the plane and to the outer regions of the substrate (e.g., along the sides thereof).

As further seen in FIG. 1, each of the members 81 which extend entirely through substrate 31 terminate at a conductive pad 41', preferably of similar shape and material as pads 41 coupled to the substrate's circuitry. In a preferred embodiment, pads 41' are relatively small (e.g., have twenty mil length and width dimension) and have a line (e.g., ten mils wide) connected thereto, this line in turn being coupled to a distant pad having a larger width and length (e.g., thirty-five mils each). Preferably, it is to these larger pads that the solder balls 51' are coupled. Such added lines and pads are not shown in the drawings for ease of explanation but are well within the understanding of those versed in the chip carrier and PCB arts. Such pads 41' (and coupled lines and larger pads), being copper or copper alloy, also further enhance heat removal. Solder balls 51' even further promote heat escape. These are preferably of the same lead-tin composition and size as solder balls 51 which each are also effective heat-sinking elements to directly pass some of the escaping heat into PCB 55 through a plurality of conductive (e.g., copper) pads 91 which form part of the PCB's topside circuitry. Understandably, heat within pads 41', balls 51' and pads 91 also passes into the ambient surrounding these elements. This, however, is reduced if an encapsulant (not shown) is used to substantially surround the lower part of package 21, as is known in the art for use in some packages.

The several heat passages as taught herein serve to provide effective means for transferring heat from chip 23. Such thermal escape is made possible while still providing a sound means for bonding the chip to the substrate's upper surface, to the extent that subsequent delamination (separation) of chip and substrate does not occur (e.g., during subsequent solder re-flow when the package's solder balls are re-flowed to couple the substrate to the underlying PCB, a period when exceedingly high temperatures are required). At such high temperatures, many known such carriers, including those with the pattern shown in FIG. 3) often delaminated, meaning that the chip tended to separate from the substrate, usually due to the moisture levels of the various components at such temperatures. The relatively large exposed surface area of the pattern of FIG. 3, having gold plating thereon, exhibited poor adhesion when using an adhesive of the type defined herein. The present invention, by providing significantly less gold surface area on the underlying concentric lines, while still presenting sufficient area for heat transfer, surprisingly eliminates this deleterious occurrence and assures a solid bond. This is also possible when using over-mold material 61. In such a case, separation may result in the formation of cracks in the over-mold material, which in turn may also expose the wirebond connections and other portions of the substrate's upper circuitry to potentially adverse conditions within the environment surrounding the invention. For example, exposure to oxygen could result in oxidation of some elements, adversely affecting the ability of such elements to provide sound connections. Cracks in the over-mold will also very likely result in broken wirebonds.

In the embodiments defined herein, the upper dielectric layer of substrate 31 immediately under the chip may comprise a solder mask material instead of one of the aforementioned other dielectric materials described above. Examples of a commercially available solder mask materials that may be used in this invention include PSR-4000 (a registered trademark of Taiyo America, Inc., Carson City, Nev.) or PC5103, an allylated polyphenylene ether (APPE), manufactured by Asahi Chemical Company of Japan. Use of a solder mask is also possible for the opposite external dielectric layer should substrate 31 include the conductive pads and other circuitry on the opposite surface thereof, as shown.

Figure 4:
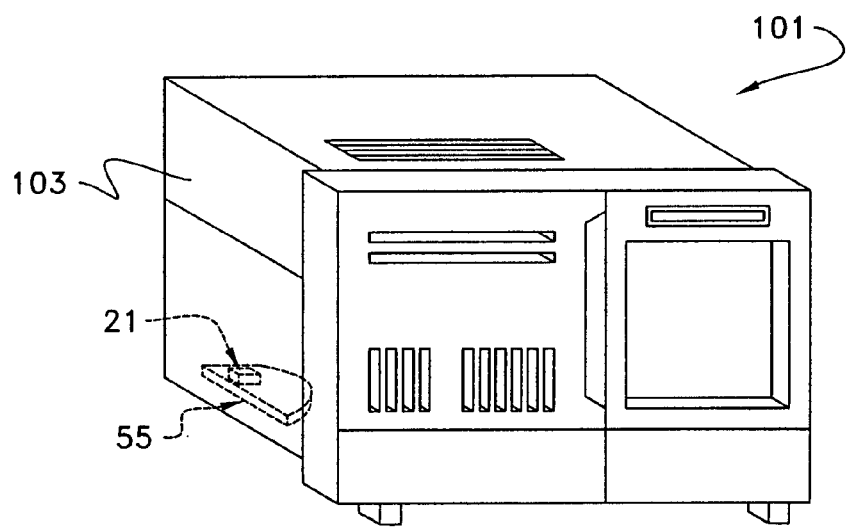
FIG. 4 is a perspective view of an information handling system adapted for using a wirebond electronic package according to one embodiment of the invention.

In FIG. 4, there is shown an information handling system 101 which is preferably a personal computer, a mainframe computer or a computer server. Other types of information handling systems known in the art of this type may also utilize the teachings of this invention. The wirebond electronic package 21 formed in accordance with the teachings herein may be utilized in the system 101 as a chip carrier (shown in phantom) mounted on PCB 55, the latter possibly as a mother board in system 101 or as one or more individual PCBs often utilized in such systems. As is known, systems such as system 101 are usually contained within a suitable metal or insulative housing such as shown by the numeral 103, with appropriate venting (if desired) therein, as well as instrumentation externally accessible for system operation by the system's designated operator. The remaining elements of information handling systems of these types, such as power supplies, fans, etc. are known in the art and further description is not believed necessary.

Figure 3:
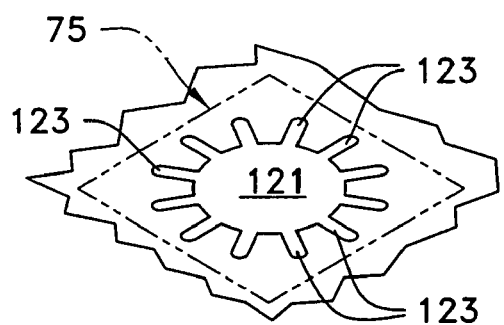
FIG. 3 is a view depicting a thermal pad design of known design.

FIG. 3 represents a known thermal pad 121 for having a chip positioned thereon. Pad 121, of solid copper material having gold plating thereon, also is positioned substantially within chip periphery 75, atop the surface of a substrate. Pad 121 somewhat resembles a floral pattern, with projecting "petals" extending from the center thereof. This pad design, as mentioned, often proved incapable of allowing a sound adhesive bond between the chip and substrate, at the elevated re-flow temperatures mentioned herein, including when the pad was connected to members such as members 81 within the substrate. As a result, the chip delaminated from the substrate. A contributing factor to such delamination was the large gold presence on the pad's upper surface, in addition to the limited exposed substrate surface area which is more adaptable for sound adhesive bonding. A distinct advantage of the concentric ring design shown in FIG. 2 is in the vastly improved adhesion characteristics between the chip and the much greater exposed top surface area of the substrate. Further, the pad design of the instant invention resulted in a package structure able to successfully meet the stringent requirements of JEDEC MSL 3 (moisture level test standard)

whereas the pad design in FIG. 3 occasionally failed such a standard, as well as the less stringent requirements of standard JEDEC MSL 5.

Thus there has been shown and described an electronic package and associated information handling system wherein a unique aspect of the package is the utilization of a chip pad which promotes thermal transfer of the chip from the substrate while also assuring a chip-substrate bond able to withstand high temperatures such as those utilized during subsequent solder re-flow operations when the substrate is bonded to an underlying PCB. A method of making the package is also provided.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a wirebond electronic package, said method comprising:

providing an organic laminate substrate having an external surface;

forming an electrically conductive circuit on said external surface of said organic laminate substrate including a plurality of wirebond pads;

forming a pattern of thermally conductive material on said external surface of said organic laminate relative to said wirebond pads of said electrical circuit, said pattern of thermally conductive material including a plurality of substantially concentric, spaced-apart lines;

positioning a semiconductor chip on said external surface of said organic laminate substrate and bonding said semiconductor chip to said external surface of said organic laminate substrate and said plurality of substantially concentric, spaced-apart lines of said pattern of thermally conductive material such that said semiconductor chip is thermally coupled to said plurality of concentric, spaced-apart lines of said pattern of thermally conductive material; and electrically connecting said semiconductor chip to said plurality of said wirebond pads.

2. The method of claim 1 wherein said forming of said electrically conductive circuit on said external surface of said organic laminate substrate is accomplished using photolithographic processing.

3. The method of claim 1 wherein said forming of said pattern of thermally conductive material on said external surface of said organic laminate substrate relative to said wirebond pads is accomplished simultaneously with said forming of said electrically conductive circuit.

4. The method of claim 1 wherein said positioning of said semiconductor chip on said external surface of said organic laminate substrate such that said semiconductor chip is bonded to said substrate and is thermally coupled to said plurality of concentric, spaced-apart lines of said pattern of thermally conductive material includes utilizing a quantity of adhesive.

5. The method of claim 1 further including providing a plurality of thermally conductive members within said organic laminate substrate in thermal connection to said concentric lines of said pattern of said thermally conductive material.

6. The method of claim 5 further including forming a plurality of openings within said organic dielectric substrate and providing said plurality of said thermally conductive members within said plurality of openings.

* * * * *